(12) United States Patent
Wong et al.

(10) Patent No.: US 8,601,351 B2
(45) Date of Patent: Dec. 3, 2013

(54) BCH DECODING WITH MULTIPLE SIGMA POLYNOMIAL CALCULATION ALGORITHMS

(75) Inventors: Jennifer K Wong, Vancouver (CA); Chun Fung Kitter Man, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 250 days.

(21) Appl. No.: 13/049,606

(22) Filed: Mar. 16, 2011

(65) Prior Publication Data

US 2012/0240013 A1 Sep. 20, 2012

(51) Int. Cl.
*H03M 13/00* (2006.01)

(52) U.S. Cl.
USPC .......................................... 714/782; 714/785

(58) Field of Classification Search
USPC .................................. 714/782, 785
See application file for complete search history.

(56) References Cited

U.S. PATENT DOCUMENTS

| | | | | |
|---|---|---|---|---|
| 6,047,395 A * | 4/2000 | Zook | | 714/756 |
| 2004/0177312 A1* | 9/2004 | Xin | | 714/782 |
| 2004/0181735 A1* | 9/2004 | Xin | | 714/758 |
| 2008/0104489 A1* | 5/2008 | Ito | | 714/794 |
| 2011/0072331 A1* | 3/2011 | Sakaue et al. | | 714/763 |
| 2012/0023384 A1* | 1/2012 | Naradasi et al. | | 714/763 |

* cited by examiner

*Primary Examiner* — M. Mujtaba K Chaudry
(74) *Attorney, Agent, or Firm* — Blakely, Sokoloff, Taylor & Zafman LLP (57) ABSTRACT

Bose-Chaudhuri-Hocquenghem (BCH) decoder architectures which execute a plurality of different algorithms to calculate an error location polynomial. The multiple algorithms may be implemented in a storage controller for increased throughput per gate count. Codewords needing up to a threshold number of corrections may be processed via a first algorithm while those with a greater number of corrections may be processed via the second algorithm. In embodiments, the Peterson-Gorenstein-Zierler (PGZ) algorithm and the Berlekamp-Massey algorithm (BMA) are executed either serially or in parallel to increase throughput of the decoder.

23 Claims, 5 Drawing Sheets

BCH DECODING WITH MULTIPLE SIGMA POLYNOMIAL CALCULATION ALGORITHMS

BACKGROUND

1. Field

Embodiments of the present invention pertain to the field of codeword decoding for data error correction, and more particularly to Bose-Chaudhuri-Hocquenghem (BCH) decoder architectures.

2. Description of Related Art

Data retrieved from memory devices, such as flash devices including NAND or NOR, DRAM memory devices, SRAM memory devices, magnetic medias, or data transferred over a communication channel may suffer errors for various reasons. Error correction schemes may be used to encode additional information for detection and/or correction of errors in the retrieved data.

Applications ranging from solid state drives to satellite communications are placing higher throughput demands on hardware responsible for the decoding of encoded data (i.e., codewords) received through a given channel. In the case of a storage controller, the decoding process can become a throughput limitation when hardware resources are limited (e.g., reduced controller chip area). In the case of a decoding engine for satellite communications, high bit error rates may again tax the decoding process to the point where the decoding hardware becomes a channel bottleneck.

BCH decoding is a popular technique employed for the correction of bit errors in a received codeword. Improved BCH decoder architectures which can increase the decoder throughput without incurring concomitant increases in gate count may achieve a given throughput with lower chip and overall system cost as well as reduced power consumption.

BRIEF DESCRIPTION OF THE DRAWINGS

Embodiments of the present invention is illustrated by way of example, and not by way of limitation, in the figures of the accompanying drawings, in which.

DETAILED DESCRIPTION

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the phrase "in an embodiment" in various places throughout this specification is not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Some portions of the detailed descriptions provide herein are presented in terms of algorithms and symbolic representations of operations on data bits within a computer memory. Unless specifically stated otherwise, as apparent from the following discussion, it is appreciated that throughout the description, discussions utilizing terms such as "calculating," "determining" "estimating" "storing" "collecting" "displaying," "receiving," "consolidating," "generating," "updating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An algorithm or method as used herein is a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of circuitry, a computer, or similar electronic computing device, that manipulate and/or transform data represented as physical, such as electronic, quantities within registers and/or memories into other data similarly represented as physical quantities within the memories and/or registers.

Embodiments of the present invention may include apparatuses for performing the operations described herein. Hardware may be specially constructed for the desired purposes, as in a combinatorial logic gates, Galois field arithmetic units, and the like, or it may comprise a general purpose computing device selectively activated or reconfigured by program instructions stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions in a non-transitory manner, and capable of being coupled to a system bus for a computing device.

Figure 1:
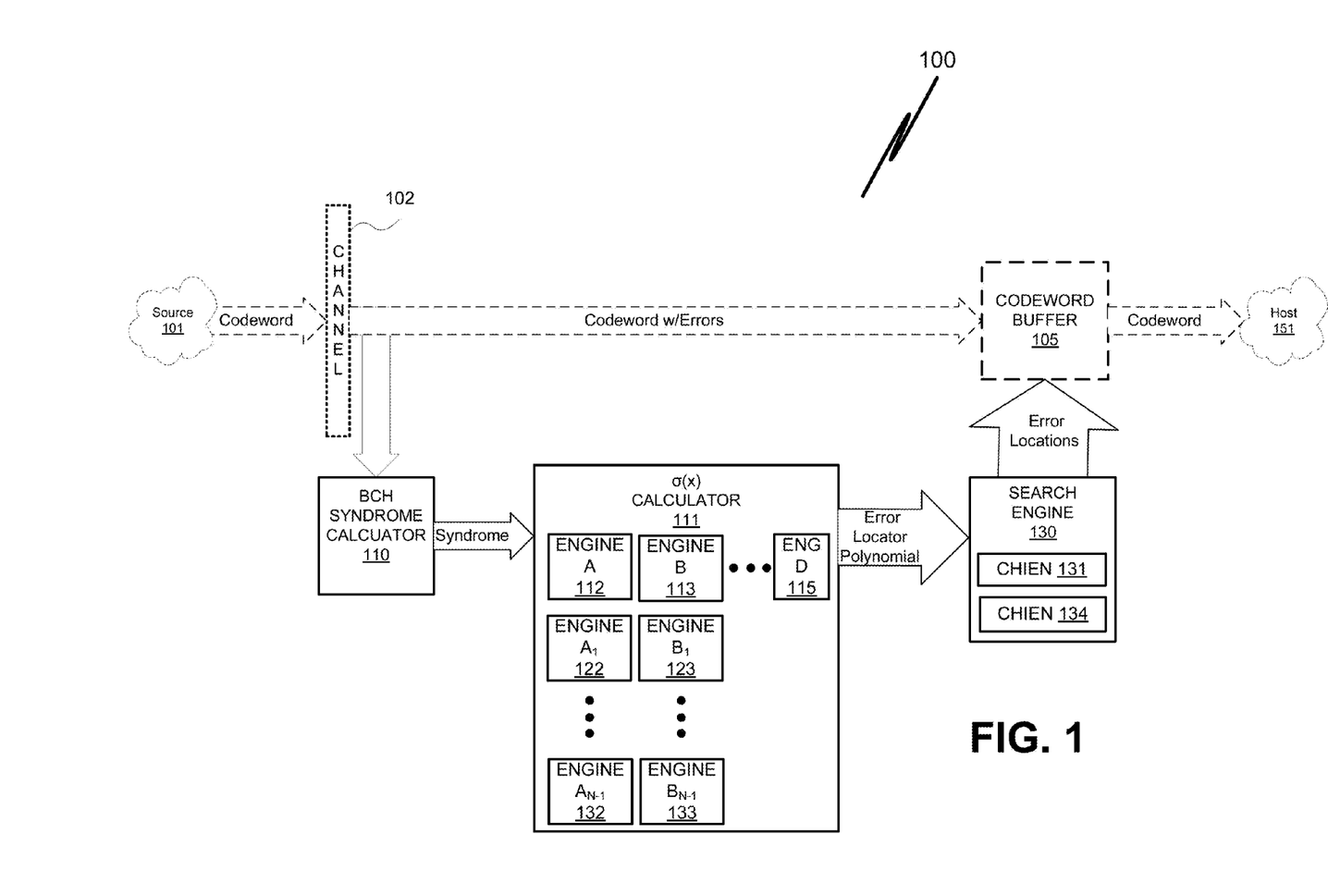
FIG. 1 is a functional block diagram of an apparatus including BCH decoder illustrating data flow paths, in accordance with an embodiment of the present invention.

FIG. 1 is a functional block diagram of an apparatus including BCH decoder 100 illustrating data flow paths, in accordance with an embodiment of the present invention. A codeword received from a source 101 is affected by a noise source through channel 102 which induces errors in the codeword. The channel may include any number of devices, such as, but not limited to storage devices or relay devices. The BCH decoder 100 receives the codeword (e.g., as read from a memory device) and the BCH syndrome calculator 110 utilizes data from the encoding phase to calculate a BCH syndrome (e.g., odd syndromes $S_1$ to $S_T$). Where the read data includes at least one bit error as compared to the content used during the encoding phase, the verification syndrome is non-zero. The non-zero syndrome is then passed to a sigma polynomial calculator 111 for calculation of the error locator polynomial $\sigma(x)$.

Embodiments described herein include a plurality of different engines executing different algorithms to compute an error locator polynomial, $\sigma(x)$, often simply referred to as the "sigma polynomial." The plurality of different engines, when properly implemented, provide the BCH decoder 100 with higher throughput relative to conventional decoders employing one or more engines of a single type. As illustrated in FIG. 1, the simga polynomial calculator 111 includes at least two different engines A, 112, and B, 113 with further embodiments including any number of additional different engines D, 115. Depending on the embodiment, there may be multiple instances for each of the different engine types A and B (e.g., $A_1$, 122 through $A_{N-1}$, 132 and $B_1$, 123 through $B_{N-1}$, 133, respectively). Generally, the engines may be cast in either the time domain and/or frequency domain, but are to be specialized to the various populations of errors particular for a given application such that the two different engines complement each other and provide more efficient performance than does a mere scaling of a single engine type. For example, various ones of the different engines may execute algorithms having degrees of computational complexity, and/or offer degrees of throughput, and/or degrees of scalability to higher numbers of corrections.

In one embodiment, the engine A, 112 executes a less computationally complex and/or less time consuming algorithm to compute the error locator polynomial than does the engine B, 113. The engine A, 112 may therefore be implemented in hardware with relatively fewer gates. In the exemplary embodiment the engine A, 112 is to execute the Peterson-Gorenstein-Zierler (PGZ) algorithm. Engine A, 112 is limited to a threshold number of corrections ($N_a$). For the exemplary PGZ algorithm, $1 \leq N_a \leq 3$. In one embodiment where $N_a=2$, engine A, 112 the PGZ algorithm may be implemented in hardware with approximately 25,000 gates, or fewer. Although a threshold $N_a$ higher than three may be utilized in alternate embodiments, the artisan will appreciate that hardware implementations of the PGZ algorithm are generally not advantageous for a significantly larger number of corrections because gate count grows very rapidly with increasing number of corrections.

The engine B, 113 is generally more scalable to process a larger number of corrections ($N_b$) than is engine A, 112 ($\leq N_b$ where $N_b > N_a$), but is to execute a computationally more complex and/or a more time consuming algorithm to compute the error locator polynomial than does the engine A, 112. In the exemplary embodiment where engine A, 112 implements the PGZ algorithm, engine B, 113 is to implement the Berlekamp-Massey Algorithm (BMA). In alternate embodiments, the engine B, 113 may execute any other known algorithm, such as the Euclidean algorithm, Massey algorithm, etc. For one embodiment where the engine B, 113 implements the BMA algorithm in hardware, the gate count depends in part on the second threshold of corrections, $N_b$. In exemplary embodiments, $N_b=15$ for a single width codeword implementation or $N_b=26$ for a double width codeword implementation with gate counts significantly greater than 25,000 typical for both exemplary embodiments such that an instantiation of engine B, 113 may require 25%, or more, additional chip area than engine A, 112.

Instances of the engine A, 112 may be utilized for processing the percentage of codewords with no more than $N_a$ bit errors while instances of the engine B, 113, requiring relatively more gates, may be dedicated to processing the subset of codewords with the number of corrections exceeding Na ($\leq N_b$ where $N_b > N_a$). The number of second engine instances may then be less than would be required to process all syndromes for a given throughput and a throughput/gate count ratio improved. As a plurality of different engines in the sigma polynomial calculator 111 increases the throughput but incurs the extra overhead for the additional engine (e.g., chip area for hardware implementations), the benefit of the different engines is greatest when there is a large percentage of codewords with no more than $N_a$ errors. Indeed, when there is a large percentage of codewords with more than $N_a$ errors, the throughput per gate ratio may actually decrease with the addition of engine A, 112. The optimal ratio of engine A, 112 instantiations versus engine B, 113 instantiations is therefore to be based on the expected probability of errors in each codeword, the amount of time needed for each engine to complete the calculations, and the budgeted gate count. In the exemplary embodiment integrating the PGZ algorithm with the BMA algorithm, a 1:2 ratio of engine A, 112 to engine B, 113 instantiations has been found to be suitable for a particular non-volatile memory (e.g., NAND flash) application. Being dependent on the application however, engine instantiation ratios of 1:1, 2:1, etc. are of course also possible and an analysis of error count frequency for a particular application may be performed to determine what engine instantiation ratio will maximize a throughput per gate ratio.

The sigma polynomial calculator 111 is to output data based on the error locator polynomial (e.g., coefficients $\sigma_1$ to $\sigma_T$) from either engine A, 112 or engine B, 113 to the search engine 130. The search engine 130 is to then find the roots of the error locator polynomial $\sigma(x)$ which correspond to bit error count and location in the codeword. The codeword with errors is then to be corrected based these error locations and output from buffer 105 to a host device 151 which itself may be any output interface, data processor, or the like, as known in the art. In one exemplary embodiment, the search engine 130 is implemented in hardware with at least a first Chien search circuitry coupled to one or both the engine A, 112 and engine B. In a preferred embodiment, separate Chien search circuitry 131 and Chien search circuitry 134 are provided with the first coupled to the engine A, 112 and the second coupled to the engine B, 113. The first Chien search circuitry 131 may be implemented with a wider bit register than the second Chien search circuitry 134 coupled to engine B, to avoid a bottleneck at the search engine 130 for those syndromes with no more than $N_a$ corrections given the higher throughput of engine A, 112. In the exemplary embodiment, the first Chien search circuitry 131 is 32-bit while the second Chien search circuitry 134 is 8-bit. With the first Chien search circuitry 131 coupled only to engine A, 112, only $N_a$ errors need be supported, keeping the gate count and combinational path length manageable.

Figure 2:
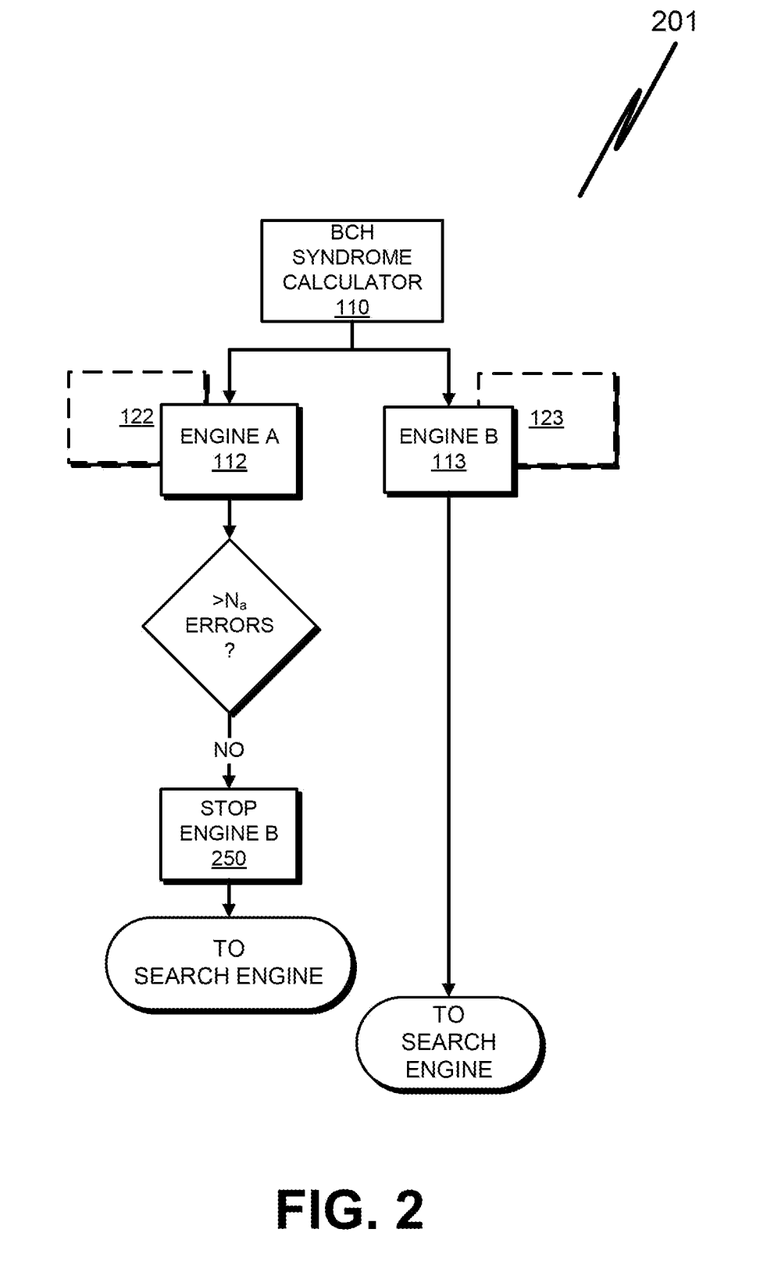
FIG. 2 is a functional block diagram illustrating a data flow path for a sigma polynomial calculator illustrated in FIG. 1 to execute multiple algorithms, in accordance with an embodiment of the present invention.

FIG. 2 is a functional block diagram illustrating a data flow path for a parallel engine architecture 201 of the sigma polynomial calculator 111, in accordance with an embodiment of the present invention. As illustrated in FIG. 2, the plurality of different engines is configured to be parallel with an engine of each type is to receive a non-zero syndrome from the BCH syndrome calculator 110 at substantially the same time. For the exemplary embodiment, the engine A, 112 and the engine B, 113 are coupled to the output of the BCH syndrome calculator 110 to receive a BCH syndrome in parallel with the engines A, 112 and the engine B, 113 to begin processing a syndrome at substantially the same time.

Depending on the relative rates of the algorithm execution, one of the engines A, 112, and B, 113 will complete processing first. For the exemplary embodiment where engine A, 112 implements the PGZ algorithm with $N_a=2$, and engine B, 113 implements the BMA algorithm with $N_b=26$, engine A, 112 will complete processing a syndrome having $N_a$ errors approximately five times sooner than will engine B, 113. Where engine A, 112 succeeds in outputting the error locator polynomial σ(x) coefficients, syndrome processing in engine B, 113 is terminated at operation 250. Where engine A, 112 fails for a syndrome having $N_a$ or more errors, engine B, 113 is allowed to complete processing and output the coefficients. In the parallel engine architecture 201, one codeword is processed at a time, but the amount of time require for all codewords processed with fewer than $N_a$ errors is reduced.

In further embodiments, either or both engine A, 112 or engine B, 113 may be scaled for greater throughput. Any of the many techniques known in the art for upscaling an error locator polynomial calculation engine may be applied to either or both of the engines A and B. For example, in one embodiment, a 1:2 engine instantiation ratio is achieved by adding a second instantiation of engine B, 123. In alternate embodiments, engine A, 112 is scaled with a second instantiation of engine A, 122 for greater total throughput with or without additional instantiations of engine B (123, 133, etc.) as needed to achieve the desired engine instantiation ratio. In one upscaled embodiment employing two instantiations of engine B (e.g., 113 and 123) and one instantiation of engine A, each instantiation of engine B is to receive a different non-zero syndrome from the BCH syndrome calculator 110. For example, where engine A, 112 fails on a first syndrome being processed in parallel with engine B, 113, engine A, 112 may then receive a second BCH syndrome in parallel with engine B, 123, while engine B, 113 continues to process the first syndrome.

Figure 3:
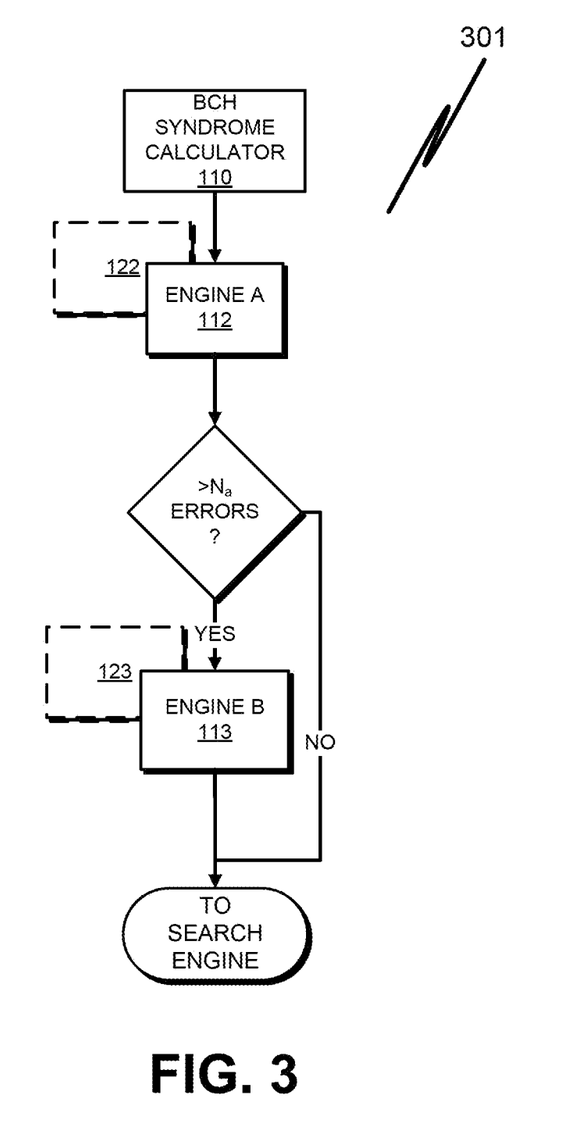
FIG. 3 is a functional block diagram illustrating a data flow path for an architecture of the sigma polynomial calculator illustrated in FIG. 1 to execute multiple algorithms, in accordance with an embodiment of the present invention.

FIG. 3 is a functional block diagram illustrating a data flow path for a serial engine architecture 301 to execute multiple algorithms in the sigma polynomial calculator 111, in accordance with an embodiment of the present invention. As illustrated, the plurality of different engines is configured to be serial. In the exemplary embodiment engine A, 112 is to receive a non-zero syndrome from the BCH syndrome calculator 110. The engine B, 113 is to receive the BCH syndrome only in response to the number of errors exceeding the threshold number of corrections, $N_a$. In the serial engine architecture 301, the engine A, 112 is to process the syndrome first and only if the engine A, 112 fails (>Na errors are detected) is the engine B, 113 to begin processing the syndrome. In a further embodiment, engine A, 112 is to begin processing a syndrome for a subsequent codeword received from the BCH syndrome calculator 110 while engine B, 113 is processing the previous codeword. As such, while engine B, 113 is processing, a second codeword may be processed simultaneously.

In the serial engine architecture 301, either or both engine A, 112 or engine B, 113 may be scaled for greater throughput via any technique for upscaling an error locator polynomial calculation engine known in the art. In one embodiment, a 1:2 engine instantiation ratio is achieved by adding a second instantiation of engine B, 123. In alternate embodiments, engine A, 112 is scaled with a second instantiation of engine A, 122 for greater total throughput with or without additional instantiations of engine B (123, 133, etc.) as needed for the desired engine instantiation ratio. An one example of an upscaled embodiment, two instantiations of engine B (e.g., 113 and 123) are integrated with one instantiation of engine A. Each instantiation of engine B is to receive a different non-zero syndrome which engine A failed to process. Engine A, 112 then may receive a third syndrome to process while both engine B, 113 and engine B,123 continue to process syndromes.

As with the engine instantiation ratio described elsewhere herein, implementation of the parallel engine architecture 201 versus the serial engine architecture 301 is application dependent with the distribution of errors being a primary factor. Generally however, in their simplest forms, the parallel engine architecture 201 requires less overhead to implement than the serial engine architecture 301.

Figure 4:
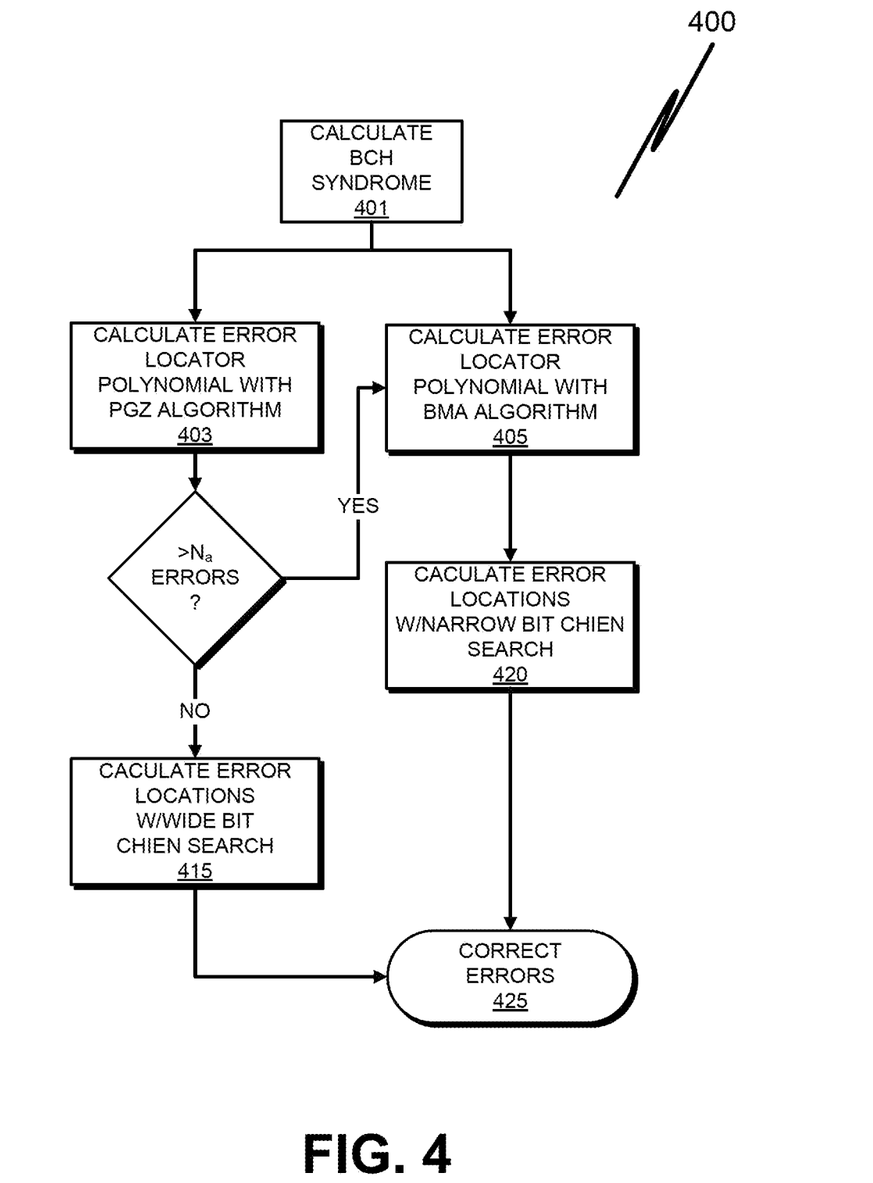
FIG. 4 is a functional block diagram illustrating a method implementing two sigma polynomial calculation algorithms in parallel, in accordance with embodiments of the present invention.

FIG. 4 is a functional block diagram illustrating a method 400 integrating the PGZ and BMA sigma polynomial calculation algorithms in parallel, in accordance with embodiments of the present invention. The method 400 begins with calculating a BCH syndrome 401 for a received codeword. At operation 403 an error locator polynomial is calculated using the PGZ algorithm employing Newton's Identities and the odd syndromes from operation 401. Concurrently with operation 405, the error locator polynomial is also calculated at operation 405 using the BMA algorithm. Following operation 403, the syndrome equations are checked to determine if there are more than Na errors, and if so the data path shifts to operation 405 where the BMA algorithm generates the coefficients.

At operations 415 and 420 roots of the error locator polynomial are then identified with a Chien search. At operation 415, following successful execution of the PGZ algorithm at operation 403, a wide bit Chien search is performed. In the alternative, after completing the BMA algorithm at operation 405, a narrow bit Chien search is performed at operation 420. As such, the Chien search is performed using a register width dependent upon the algorithm used for calculating an error locator polynomial. With the error locations identified, the bits are then corrected at operation 425 using any commonly known technique.

Figure 5:
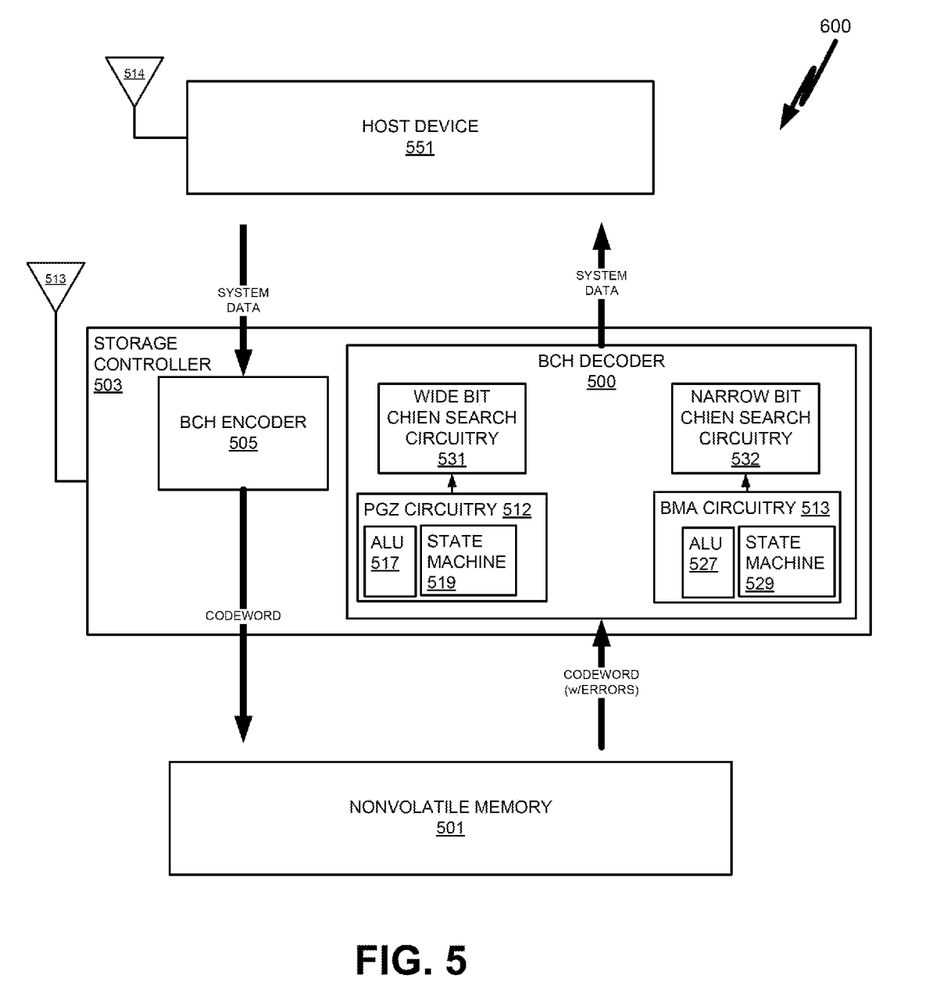
FIG. 5 is an apparatus including a BCH decoder in accordance with an embodiment of the present invention.

FIG. 5 is an apparatus 600 including a BCH decoder 500 in accordance with an embodiment of the present invention. The apparatus 600 is an exemplary hardware implementation of a storage controller 503 including the BCH decoder 500 for executing multiple sigma polynomial calculation algorithms (e.g., any of those described in reference to FIGS. 2, 3 and 4). In a first exemplary embodiment, the apparatus 600 is a component of a computing platform chipset supporting one or more microprocessors, each microprocessor having one or more cores. In a second exemplary embodiment, the apparatus 600 is implemented as a component of a discrete solid state storage device, for example as a portable flash drive (i.e., thumb drive) which may be coupled via a standard compliant communication interface (e.g., USB) to a wide variety of electronic devices. In a third exemplary embodiment, the storage controller 503 is implemented as a controller IC which may be incorporated into any system level design.

As shown in FIG. 5, the storage controller 503 interfaces with a nonvolatile memory 501 which may comprises any non-volatile memory array known in the art, such as NAND flash, NOR flash, etc. In one such embodiment, the nonvolatile memory 501 stores multiple bits per cell (i.e., MLC) and may have relatively high RBER. The storage controller 503 further interfaces with a host device 551. The controller 503 optionally employs a wireless communication interface including a transmitter/receiver and antenna 513 through which system data is sent/received wirelessly to/from a host device transmitter/receiver and antenna 514.

The storage controller 503 includes a BCH encoder 505 to encode system data received from a host device 551 and to store a resulting codeword to the nonvolatile memory 501. In exemplary embodiments, the host device is a data processor on a same platform as the storage controller 503 or wireless access point (WAP) in wireless communication with the storage controller 503 which allows the storage controller 503 to interface to a wired network. The storage controller 503 further includes the BCH decoder 500 to receive a codeword stored in the nonvolatile memory 501 and to output system data to the host device 551. The BCH decoder 500 includes PGZ circuitry 512 which is to execute the PGZ algorithm and calculate the error locator polynomial from a received codeword. The BCH decoder 500 further includes BMA circuitry 513 to execute the BMA algorithm and calculate the error locator polynomial from a received codeword. The PGZ circuitry 512 further includes an arithmetic logic unit (ALU) 517 to calculate the coefficients and a state machine 519 to control the ALU 517. The BMA circuitry 513 further includes an ALU 527 and state machine 529 to control the ALU 527. The PGZ circuitry 512 is coupled to a wide bit Chien search circuitry 531 to implement a Chien search using wider bit registers than does the narrow bit Chien search circuitry 532.

It is to be understood that the above description is intended to be illustrative, and not restrictive. Many other embodiments will be apparent to those of skill in the art upon reading and understanding the above description. For example, the system data sent by the host device 551 may be encoded data and the BCH decoder 500 is to decode the encoded data received from the host device 551 (e.g., wirelessly) as part of a data channel processing pipeline.

Although the present invention has been described with reference to specific exemplary embodiments, it will be recognized that the invention is not limited to the embodiments described, but can be practiced with modification and alteration. Accordingly, the specification and drawings are to be regarded in an illustrative sense rather than a restrictive sense.

What is claimed is:

1. A Bose-Chaudhuri-Hocquenghem (BCH) decoder, comprising:
    a first engine to calculate, by a first algorithm, an error locator polynomial from a BCH syndrome of a received codeword;
    a second engine to calculate, by a second algorithm, the error locator polynomial from the BCH syndrome of the received codeword; and
    circuitry to output data based on the error locator polynomial from either the first engine or the second engine.

2. The decoder of the claim 1, wherein the first engine comprises hardware limited to processing a number of corrections no greater than a threshold, wherein the error locator polynomial is output from either the first engine or the second engine depending on a number of errors detected from the BCH syndrome.

3. The decoder of claim 2, wherein the threshold is 1,2, or 3 errors.

4. The decoder of claim 1, wherein the first algorithm is a Peterson-Gorenstein-Zierler (PGZ) algorithm.

5. The decoder of claim 4, wherein the second algorithm is a Berlekamp-Massey Algorithm (BMA).

6. The decoder of claim 1, wherein the first and second engines are in parallel, both engines to receive the BCH syndrome from a syndrome calculator at substantially the same time.

7. The decoder of claim 1, wherein the first and second engines are in series, the first engine to receive the BCH syndrome from a syndrome calculator and the second engine to receive the BCH syndrome only in response to the number of errors exceeding the threshold.

8. The decoder of claim 1, wherein at least one of the first engine and second engine comprises multiple instantiations of a same engine type to process multiple BCH syndromes in parallel.

9. The decoder of claim 1, further comprising a first Chien search circuitry coupled to the first engine to receive the output data and a second Chien search circuitry coupled to the second engine to receive the output data.

10. The decoder of claim 9, wherein the first Chien search circuitry has a substantially wider register width than the second Chien search circuitry.

11. The decoder of claim 1, wherein the first engine further comprises a first arithmetic logic unit (ALU) and a first state machine to control the first ALU, and wherein the second engine further comprises a second ALU and a second state machine to control the second ALU.

12. An apparatus, comprising:
    a storage device interface to receive a codeword from a storage device;
    a Bose-Chaudhuri-Hocquenghen (BCH) decoder to locate bit errors in the codeword, wherein the BCH decoders further comprises:
        a first engine to calculate, by a first algorithm, an error locator polynomial from a BCH syndrome of the codeword;
        a second engine to calculate, by a second algorithm, the error locator polynomial from the BCH syndrome of the codeword; and
    a host interface to output data based on the codeword to a host device.

13. The apparatus of claim 12, further comprising:
    a codeword buffer to store the codeword while the bit errors are located;
    logic to correct a codeword bit error determined from the error locator polynomial; and
    circuitry to output the corrected codeword to the host interface.

14. The apparatus of claim 12, further comprising the storage device, wherein the storage device comprises a nonvolatile semiconductor-based memory.

15. A method for correcting errors in a codeword, the method comprising:
    receiving a BCH syndrome of the codeword;
    calculating an error locator polynomial by processing the BCH syndrome with at least one of a first algorithm and a second algorithm depending on a number of errors detected from the BCH syndrome exceeding a threshold; and
    calculating a bit error location by determining roots of the error locator polynomial.

16. The method of claim 15, wherein calculating the error locator polynomial further comprises:
    processing the BCH syndrome with the first algorithm;
    determining if the number of codeword errors exceeds a threshold; and
    processing the BCH syndrome with the second algorithm in response to the number of codeword errors exceeding the threshold.

17. The method of claim 15, wherein the BCH syndrome is processed with the first algorithm in parallel with the second algorithm and wherein the second algorithm is terminated upon determining the number of codeword errors does not exceed the threshold.

18. The method of claim 15, wherein the BCH syndrome is processed with the first algorithm before it is processed with the second algorithm.

19. The method of claim 15, further comprising:
performing a Chien search to determine the roots of the error locator polynomial, the Chien search performed with circuitry having a register width dependent upon whether the first or second algorithm is used for calculating the error locator polynomial.

20. The decoding method of claim 15, wherein the first algorithm is a Peterson-Gorenstein-Zierler (PGZ) algorithm and wherein the second algorithm is a Berlekamp-Massey Algorithm (BMA), and wherein the threshold is 1, 2, or 3 errors.

21. A system, comprising:
a host device having a first antenna;
a storage device interface to receive a codeword from a storage device;
a Bose-Chaudhuri-Hocquenghem (BCH) decoder to locate bit errors in the codeword, wherein the BCH decoders further comprises:
a first engine to calculate, by a first algorithm, an error locator polynomial from a BCH syndrome of the codeword;
a second engine to calculate, by a second algorithm, the error locator polynomial from the BCH syndrome of the codeword; and
a second antenna to output data based on the codeword to the host device.

22. The system as in claim 21, wherein the host device is a wireless access point coupled to a wired network.

23. The system as in claim 21, wherein the first algorithm is a Peterson-Gorenstein-Zierler (PGZ) algorithm and wherein the second algorithm is a Berlekamp-Massey Algorithm (BMA).

\* \* \* \* \*